United States Patent [19]

Pennisi et al.

[11] Patent Number: 5,313,365
[45] Date of Patent: May 17, 1994

[54] ENCAPSULATED ELECTRONIC PACKAGE

[75] Inventors: Robert W. Pennisi, Boca Raton; Glenn E. Gold, Coconut Creek; Frank J. Juskey; Glenn F. Urbish, both of Coral Springs, all of Fla.

[73] Assignee: Motorola, Inc., Schaumburg, Ill.

[21] Appl. No.: 906,346

[22] Filed: Jun. 30, 1992

[51] Int. Cl.$^5$ .............. H05K 7/02; H01L 23/28
[52] U.S. Cl. ..................... 361/760; 174/52.2; 257/788
[58] Field of Search ............. 257/787, 788, 789, 790, 257/791, 792, 793, 794, 795, 678, 701, 702; 174/52.2, 52.3, 52.4; 361/392, 394, 395, 397, 399, 400, 401

[56] References Cited

U.S. PATENT DOCUMENTS

| | | | |
|---|---|---|---|
| 4,278,784 | 7/1981 | Wong | 528/27 |
| 4,900,779 | 2/1990 | Leibfried | 524/862 |
| 4,902,731 | 2/1990 | Leibfried | 523/222 |
| 4,961,105 | 10/1990 | Yamamoto | 174/52.4 |

FOREIGN PATENT DOCUMENTS 1051642 2/1989 Japan .

OTHER PUBLICATIONS

Dr. John K. Bard and Dr. Julia S. Burnier, Hercules Incorporated, Wilmington, Delaware, article entitled "New Low Dielectric Constant Moisture Resistant Resin Technology for High Speed/High Frequency Circuit Board Applications".

*Primary Examiner*—Leo P. Picard
*Assistant Examiner*—Bot LeDynh
*Attorney, Agent, or Firm*—Dale W. Dorinski

[57] ABSTRACT

An encapsulated electronic package (10) is made by bonding one or more semiconductor devices or integrated circuits (16) to a printed circuit board with an adhesive (14), and covering with a glob top encapsulant (15). The printed circuit board has a metal circuit pattern (12) on one side, and, optionally, solder pads (27) on the second side. The glob top encapsulant covers the integrated circuit, portions of the metal circuit pattern, and portions of the printed circuit board surface. The printed circuit board, the adhesive, and the encapsulant are all made from the same type of resin. In the preferred embodiment of the invention, the resin used to make the printed circuit board, the adhesive, and the encapsulant is an organosilicon polymer comprised substantially of alternating polycyclic hydrocarbon residues and cyclic polysiloxane or siloxysilane residues linked through carbon-silicon bonds.

4 Claims, 3 Drawing Sheets

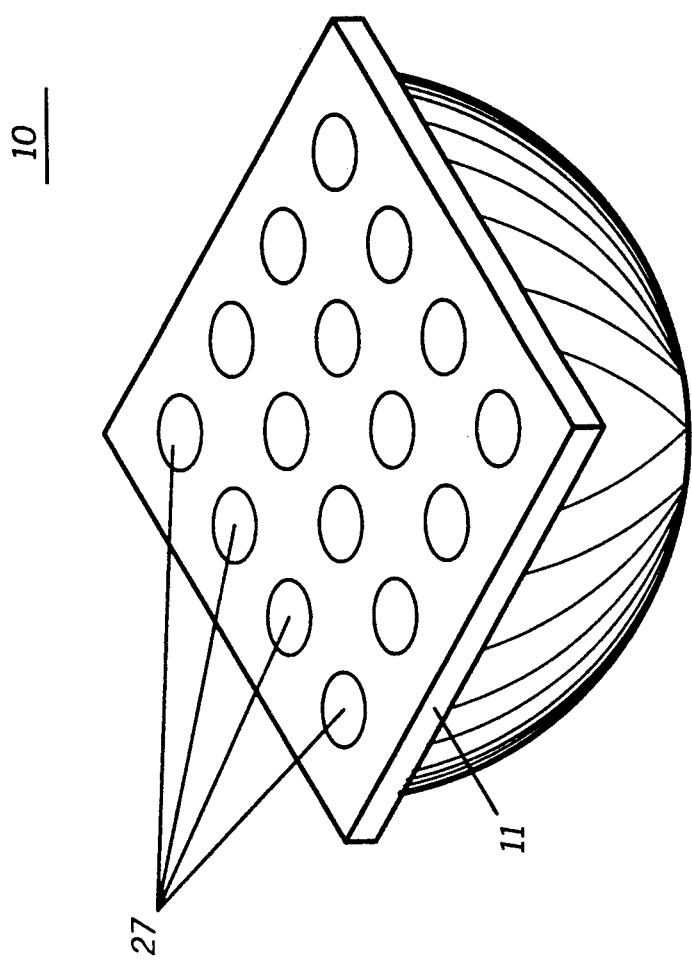

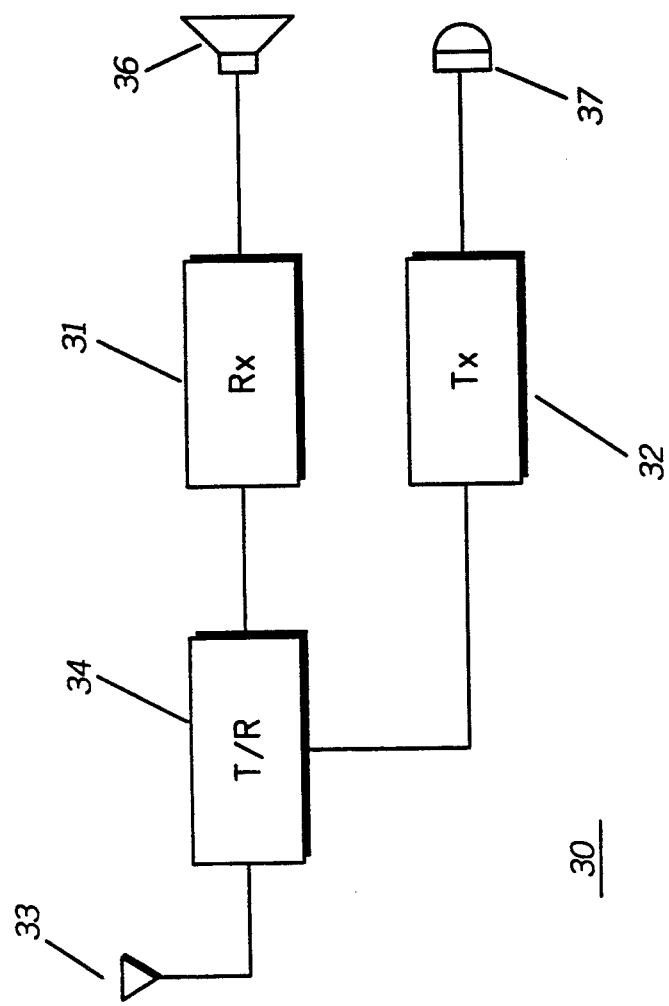

ENCAPSULATED ELECTRONIC PACKAGE

TECHNICAL FIELD

This invention relates generally to electronic packages for semiconductor devices and integrated circuits, and most particularly to encapsulation of semiconductors directly attached to a circuit substrate.

BACKGROUND

Electronic packaging technology has undergone dramatic changes during the past decade, driven by reliability, size and price considerations. Newer packaging technologies are competing with or replacing dual in-line packages (DIP) and plastic leaded chip carriers for single and multiple chip packaging. Several of these packaging methods include flip chip, chip on board, and tape automated bonding. All three methods involve the use of liquid encapsulants to protect the chip and the electrical interconnections from physical damage and ionic contamination. The encapsulants are dispensed to form a glob over the chip and the electrical interconnections, hence the term glob-top encapsulant. Glob-top encapsulation was originally introduced for consumer packages such as video games, but the demand for miniaturized circuitry led to the use of glob-top as the preferred assembly method for many types of products including smart credit cards, microprocessor circuitry, and complex hybrids. This encapsulation technology allows the manufacturer to make relatively thin devices, and many companies produce packages with cost equal to or less than conventional plastic packages.

Typical glob-top compositions include epoxy or silicone encapsulating resins which provide protection against corrosion, vibration and mechanical stresses. These resins have achieved a high degree of popularity because the dispensing process can be easily automated, high yields are obtainable, and material costs are low. Stringent performance specifications are required for microelectronic encapsulations to insure that no physical or electrical degradation of the device occurs. The purpose of an encapsulant is to protect the chip and fragile wire bonds. An encapsulant should not create unusual stresses during thermal cycling, and it should protect the chip from mechanical shock, moisture, and various chemicals. Matching the coefficient of thermal expansion to the substrate and the chip is critical for long term dimensional stability and proper sealing of leads to prevent penetration of moisture and ionic contaminants. Encapsulants must have low moisture absorption and be of high purity, i.e., a low level of ionic contaminants such as lithium, sodium, potassium, and chlorine ions. This is very important because ionic contaminants can result in corrosion of chip metallizations under conditions of high humidity.

The application of glob top encapsulation for integrated circuit (IC) packaging protection has been limited to low end consumer electronic applications because of the inferior environmental performance of this type of package compared to molded or ceramic packages. Conventional technology uses one type of resin for the printed circuit board (typically a thermoset polyimide), a second type of resin for the die attach adhesive (typically a novalac-modified bisphenol/epichlorhydrin-based epoxy and a conductive filler), and a third type of resin for the glob top encapsulant (typically a silicone-modified epoxy resin or a silicone resin). Differences in the physical and electrical properties of the diverse materials used in the printed circuit board, the adhesive, and the encapsulant result in poor adhesion of the adhesive and encapsulant to the printed circuit board, and moisture absorption through the encapsulant into the adhesive. This creates dielectric shifts and corrosion, resulting in poor electrical performance of the package. Overmolded pin grid array and ceramic pin grid array packages are the alternatives for high performance applications, but these types of packages are more expensive than glob top. The popularity of integrated circuit chips packaged in glob-top requires a solution that will provide the environmental performance and reliability found in the more expensive packages.

Clearly a glob top package which could provide the cost and size advantages of glob top with the environmental performance advantages of ceramic or molded packages would be desirous.

SUMMARY OF THE INVENTION

Briefly, according to the invention, there is provided an encapsulated electronic package, comprising a printed circuit board with a metal circuit pattern on one side. One or more semiconductor devices are attached to the printed circuit board with an adhesive, and covered by a glob top encapsulant. The glob top encapsulant also covers portions of the printed circuit board surface. The printed circuit board, the adhesive, and the encapsulant are all made from the same type of resin.

In one embodiment of the invention, the resin used to make the printed circuit board, the adhesive, and the encapsulant is an organosilicon polymer comprised substantially of alternating polycyclic hydrocarbon residues and cyclic polysiloxane or siloxysilane residues linked through carbon-silicon bonds.

In a further embodiment of the invention, the resin used to make the printed circuit board and the encapsulant is an organosilicon polymer comprised substantially of alternating polycyclic hydrocarbon residues and cyclic polysiloxane or siloxysilane residues linked through carbon-silicon bonds.

In still a further embodiment of the invention, the resin used to make the adhesive and the encapsulant is an organosilicon polymer comprised substantially of alternating polycyclic hydrocarbon residues and cyclic polysiloxane or siloxysilane residues linked through carbon-silicon bonds.

Yet another embodiment of the invention incorporates the electronic package in a radio communications device. The radio comprises an antenna and a receiver portion connected to the antenna, the receiver portion comprising the electronic package of the instant invention.

BRIEF DESCRIPTION OF THE DRAWINGS

FIG. 2 is an isometric view of a pad grid array chip carrier made in accordance with the invention.

FIG. 3 is a schematic block diagram of a radio incorporating the electronic package in accordance with the invention.

DETAILED DESCRIPTION OF THE PREFERRED EMBODIMENT

Figure 1:
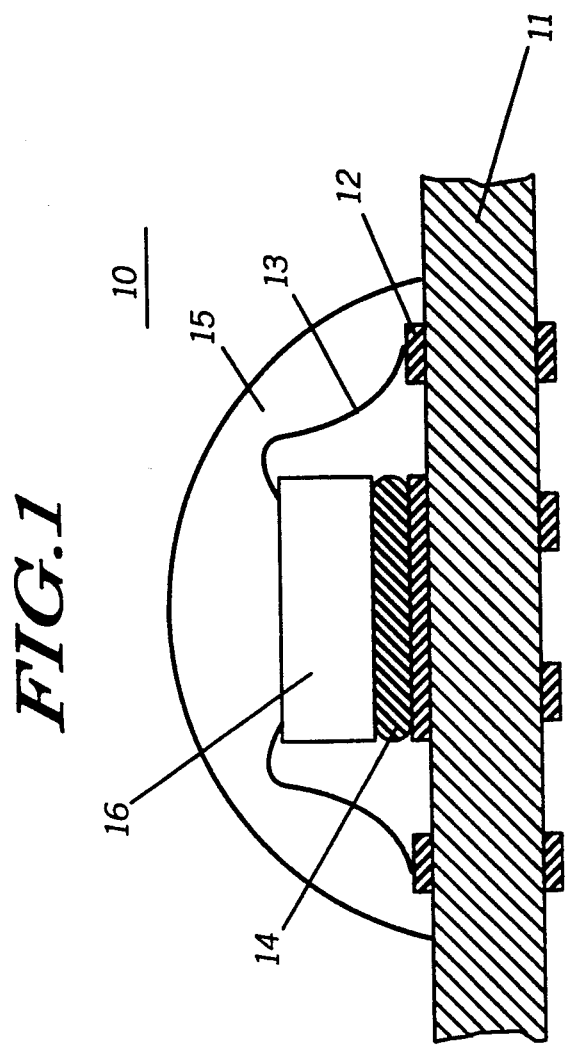
FIG. 1 is a cross-sectional view of an electronic package made in accordance with the invention.

While the specification concludes with claims defining the features of the invention that are regarded as novel, it is believed that the invention will be better understood from a consideration of the following description in conjunction with the drawing figures, in which like reference numerals are carried forward. Referring now to FIG. 1, an integrated circuit die or semiconductor device, 16 is electrically and mechanically attached to electrical conductors 12 on a printed circuit board (PCB) 11. The PCB 11 comprises an electrically insulating material, such as a fiberglass-reinforced resin, typically used in a laminated construction. The electrical conductors 12 are formed on the PCB using any suitable process, for example by photo-imaging and chemically etching. The die 16 is bonded to a region of the PCB 11 using, for example, a suitable adhesive 14 such as a conductive adhesive filled with silver. The die 16 is electrically interconnected via gold, tin plated copper, or aluminum wires 13 to the electrical conductors 12. It will be understood that the wires 13 comprise any suitable electrical conductors connected with any suitable bond. For example, the wires 13 can comprise ultrasonically bonded wires, Tape Automated Bonding (TAB) or flip chip bonding.

A glob top coating or encapsulant 15 is deposited over the die 16, wires 13, portions of the electrical conductors 12, and portions of the PCB 11. The encapsulant 15 is deposited while in a viscous state and flows to cover the affected areas. The encapsulant 15 can comprise any curable material which exhibits qualities suitable for encapsulating electronic components, such as being: electrically insulating; moisture resistant; adhesive to the PCB; and exhibiting a coefficient of thermal expansion substantially matching that of the PCB 11. After deposition of the encapsulant 15, it is cured to a solid form by exposure to heat or other cross linking means, such as radiation, hence hardening the encapsulant. The encapsulant 15 may be cured at room temperature or may be cured at an elevated temperature, depending on the selection of the encapsulating material. Materials used for encapsulating semiconductor devices and methods of curing these materials are well known to those skilled in the art of glob-top applications and many references are available in the literature. For example, Wong, in U.S. Pat. No. 4,278,784 dated Jul. 14, 1981 describes a method of encapsulating an electronic device using silicone resin.

In a preferred embodiment of the invention described above, the resin used to make the PCB 11, the die attach adhesive 14, and the encapsulant 15 is the same type of base resin. Although numerous resins are candidate materials for this application, for example, epoxies, urethanes, silicones, polyimides, polyesters, and copolymers and blends thereof, organosilicon resins have been found to be particularly suitable for these applications. These resins are substantially comprised of alternating polycyclic hydrocarbon residues and cyclic polysiloxane or tetrahedral siloxysilane residues linked through carbon-silicon bonds. They are the reaction product of a cyclic polysiloxane or tetrahedral siloxysilane and a polycyclic polyene. Examples of suitable organosilicon polymer resins may be found in U.S. Pat. No. 4,900,779 and 4,902,731, which are hereby incorporated by reference. These resins are sold under the trade name SYCAR ® by Hercules Incorporated of Wilmington, Del.

A fiberglass reinforced laminate PCB made with SYCAR ® resin exhibits low dielectric constant, high glass transition temperature, low expansion coefficient, and low moisture absorption. Similar properties are found in the die attach adhesive and the encapsulating adhesive, thereby insuring the integrity of the finished package. By utilizing the same resin type throughout the structure, the adhesion of the die attach adhesive 14 to the PCB 11, the encapsulant 15 to the PCB, and the adhesive to the encapsulant is maximized since similar materials are known to bond together better than dissimilar materials. In addition, the low moisture absorption and dielectric constant provides for a package that has superior electrical performance compared to conventional systems. When conventionally packaged glob top IC's are exposed to moisture, the electrical properties change as they absorb moisture. The use of the low moisture absorbing organosilicon polymers keeps the dielectric constant from changing, providing a novel electronic package.

An alternate embodiment of the invention finds an electronic package wherein the glob top encapsulant 15 and the die attach adhesive 14 use the same resin, but the PCB 11 is made from a different resin. For example, the encapsulant 15 and the adhesive 13 are made from an organosilicon polymer, and the PCB 11 is made from a polyimide or epoxy resin. While this package does not have all the attributes found in the preferred embodiment, it does provide a level of performance and reliability greater than that found in a conventional glob top package where all three of the materials are based on different resins.

Another embodiment of the invention finds an electronic package wherein the glob top encapsulant 15 and the PCB 11 use the same resin, but the die attach adhesive 14 is made from a different resin. For example, the encapsulant 15 and the PCB 11 are made from an organosilicon polymer, and the adhesive 14 is made from an epoxy resin. While this package does not have all the attributes found in the preferred embodiment, it provides a level of performance and reliability greater than that found in a conventional glob top package where all three of the materials are based on different resins.

Still another embodiment of the invention incorporates an array of solder pads 27 on the back side of the PCB 11, as shown in FIG. 2. The array of solder pads 27 may be in a regularly spaced arrangement as shown in the figure, or it may be other arrangements, such as irregular spacing, or spacing with features such as ground planes or open areas. The solder pads 27 may also contain solder bumps or spheres (not shown) soldered to the pads to aid in connecting the electronic package 10 to a second PCB (not shown). In such a configuration, the electronic package 10 is typically in the form of a chip carrier, such as a pad grid array chip carrier, for example. Pin grid array carriers may also be employed, where the solder pads are replaced with pins. Typically, the solder pads 27 or pins are electrically connected to the integrated circuit die on the opposite side of the PCB, either by plated through holes or by blind vias.

In a further embodiment of the invention, the electronic package as described herein may find particular use in portable communications applications. Referring to FIG. 3, the electronic package of the present invention is utilized in a radio 30 comprising any well-known radio, such as portable two-way radios manufactured by Motorola Inc., which may operate in either receive or transmit modes. The radio 30 includes a receiver section 31 and a transmitter section 32 which comprise means for communicating, that is, transmitting or receiving communication signals for the radio.

In the receive mode, the portable radio 30 receives a communication signal via an antenna 33. A transmit/receive (T/R) switch 34 couples the received communication signal to the receiver 31. The receiver 31 receives and demodulates the received communications signal and presents its audio component to a speaker 36. It may be appreciated by one of ordinary skill in the art that other functions not herein described may be provided by any suitable means, including a controller means (not shown), which controls the entire operation of the radio 30.

In the transmit mode, audio messages are coupled from a microphone 37, where they are used to modulate a carrier signal as is well known in the art. The modulated carrier signal is then applied to the antenna 33 through the T/R switch 34 for transmission of the communication signal. It may be appreciated that the electronic package, according to the principals of the present invention, may be utilized in suitable sections of the transmitter or receiver sections 32 and 31, respectively.

The use of the same type of resin for the printed circuit board, the adhesive, and the encapsulant provides improvements in reliability and electrical performance over that normally seen with conventional glob top packaging, at a cost less than that found in ceramic or molded plastic packages. In addition, this invention also provides for a small sized, high performance package for electronic devices. While the preferred embodiments of the invention have been illustrated and described, it will be clear that the invention is not so limited. Numerous modifications, changes, variations, substitutions and equivalents will occur to those skilled in the art without departing from the spirit and scope of the present invention.

What is claimed is:

1. An electronic package, comprising:
   a printed circuit board having a metal circuit pattern disposed on a first major surface thereof;
   a semiconductor device attached to the printed circuit board by means of an adhesive;
   an encapsulant covering the semiconductor device and portions of the printed circuit board major surface; and
   the adhesive and the encapsulant comprising an organosilicon polymer comprised substantially of alternating polycyclic hydrocarbon residues and cyclic polysiloxane or siloxysilane residues linked through carbon-silicon bonds.

2. The electronic package as described in claim 1, wherein the semiconductor device is an integrated circuit chip.

3. The electronic package as described in claim 2, wherein the semiconductor device is wirebonded to the metal circuit pattern.

4. The electronic package as described in claim 1, further comprising an array of solder pads situated on a second opposing major surface of the printed circuit board and electrically connected to the semiconductor device.

* * * * *